(12) United States Patent
Zhang et al.

(10) Patent No.: US 9,594,124 B2
(45) Date of Patent: Mar. 14, 2017

(54) BATTERY CHARGE METER TESTING (71) Applicant: Infineon Technologies AG, Neubiberg (DE)

(72) Inventors: Chunyan Zhang, Singapore (SG); Tue Fatt David Wee, Singapore (SG); Yiming Tang, Singapore (SG); Siow Kiat Tan, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 476 days.

(21) Appl. No.: 14/279,044

(22) Filed: May 15, 2014

(65) Prior Publication Data

US 2015/0331056 A1   Nov. 19, 2015

(51) Int. Cl.
*G06F 19/00* (2011.01)
*G01R 31/36* (2006.01)

(52) U.S. Cl.
CPC ..... *G01R 31/3651* (2013.01); *G01R 31/3624* (2013.01); *G01R 31/3634* (2013.01); *G01R 31/3648* (2013.01)

(58) Field of Classification Search
CPC ............ G06F 3/017; G02B 2027/0178; G02B 27/017
USPC ............................................... 702/53, 60, 64
See application file for complete search history.

(56) References Cited

U.S. PATENT DOCUMENTS

| | | | |
|---|---|---|---|
| 6,169,387 B1* | 1/2001 | Kaib | A61N 1/3931 320/132 |
| 8,400,162 B1* | 3/2013 | Jannson | G01R 31/3651 320/132 |
| 8,489,348 B2 | 7/2013 | Shirriff et al. | |

* cited by examiner

*Primary Examiner* — Edward Raymond
(74) *Attorney, Agent, or Firm* — Shumaker & Sieffert, P.A.

(57) ABSTRACT

A circuit includes a first analog to digital converter configured to convert an analog voltage sample of a rechargeable power source into a digital voltage value, a second analog to digital converter configured to convert an analog current sample of the rechargeable power source into a digital current value, a charge state controller configured to determine a charge state of the rechargeable power source based on the digital voltage value and the digital current value, and a communication interface configured to output a computer-readable indication of the charge state. The charge state controller is further configured to receive pregenerated voltage values and pregenerated current values, and determine a simulated charge state of the rechargeable power source based on the pregenerated voltage values and the pregenerated current values. The communication interface is further configured to output a computer-readable indication of the simulated charge state.

20 Claims, 4 Drawing Sheets

BATTERY CHARGE METER TESTING

TECHNICAL FIELD

The disclosure relates to testing of battery charge meters using pre-generated battery measurement data.

BACKGROUND

Devices that include batteries, such as personal electronic devices like cellular phones, often include the capability to indicate a charge state of the battery to a user. In order to estimate the charge state of the battery, the product may include one or more sensors, such as a current sensor and/or a voltage sensor. To estimate the charge state of the battery, the device may apply a charge state algorithm to the sensor data produced by the sensors.

SUMMARY

Evaluation of a battery charge meter of a device may be performed using predefined sensor data by a charge state controller for the device. As compared to techniques in which actively measured sensor data is used to evaluate a battery charge meter of a device, the disclosed techniques may offer significant time savings for testing and evaluation of the battery charge meter.

In one example, this disclosure is directed to a circuit comprising a first analog to digital converter configured to convert an analog voltage sample of a rechargeable power source into a digital voltage value, a second analog to digital converter configured to convert an analog current sample of the rechargeable power source into a digital current value, a charge state controller configured to determine a charge state of the rechargeable power source based on the digital voltage value and the digital current value, and a communication interface configured to output a computer-readable indication of the charge state. The charge state controller is further configured to receive pregenerated voltage values and pregenerated current values, and determine a simulated charge state of the rechargeable power source based on the pregenerated voltage values and the pregenerated current values. The communication interface is further configured to output a computer-readable indication of the simulated charge state.

In some examples, the circuit further comprises a temperature sensor configured to output a digital temperature value representative of a measured temperature associated with the rechargeable power source to the charge state controller, wherein the charge state controller is configured to determine the charge state of the rechargeable power source further based on the digital temperature value, wherein the charge state controller is further configured to: receive pregenerated temperature values, and determine the simulated charge state of the rechargeable power source further based on the pregenerated temperature values.

In some examples, the circuit comprises an integrated circuit comprising the first analog to digital converter, the second analog to digital converter, the temperature sensor, and the charge state controller.

In the same or different examples, the charge state controller is further configured to determine available runtime of the rechargeable power source based on the digital voltage value and the digital current value, the communication interface is further configured to output a computer-readable indication of the available runtime, the charge state controller is further configured to determine simulated available runtime of the rechargeable power source based on the pregenerated voltage values and the pregenerated current values, and the communication interface is further configured to output a computer-readable indication of the simulated available runtime.

In the some examples, the charge state controller is configured to determine available runtime of the rechargeable power source further based on indications of usage of an electronic device powered by the rechargeable power source, the indications of usage including at least one of a first group consisting of: power on history, shutdown history, call activity, upstream data transmissions, downstream data transmissions, and charging history. The charge state controller may be configured to determine simulated available runtime of the rechargeable power source further based on pregenerated indications of usage of an electronic device powered by the rechargeable power source, the pregenerated indications of usage including at least one of a second group consisting of: power on history, shutdown history, call activity, upstream data transmissions, downstream data transmissions, and charging history.

In the same or different examples, the charge state controller is configured to determine the charge state of the rechargeable power source based on the digital voltage value and the digital current value over time, wherein the pregenerated voltage values and pregenerated current values represent values over time, and wherein the charge state controller is configured to determine the simulated charge state of the rechargeable power source based on the pregenerated voltage values and pregenerated current values over time.

In the same or different examples, the circuit comprises an integrated circuit comprising the first analog to digital converter, the second analog to digital converter, and the charge state controller.

In the same or different examples, the communication interface is selected from a group consisting of: Battery Interface v1.0 Specification, Inter-Integrated Circuit (I²C), Version 5, System Management Bus (SMBus), and Universal Asynchronous Receiver/Transmitter (UART) according to one or more of the following UART models: 16550A, 16C552, 16650, 16750, 16850, 16C850, 16954, 16C954, SCC2691, SCC2692, SCC26C92, SCC2698B, SCC28C94, Z85230, and Hayes ESP.

In another example, this disclosure is directed to a personal electronic device comprising a rechargeable power source, a voltage sensor, a current sensor, a first analog to digital converter configured to convert an analog voltage sample of the rechargeable power source from the voltage sensor into a digital voltage value, a second analog to digital converter configured to convert an analog current sample of the rechargeable power source the current sensor into a digital current value, a charge state controller configured to determine a charge state of the rechargeable power source based on the digital voltage value and the digital current value, and a communication interface configured to output a computer-readable indication of the charge state. The charge state controller is further configured to receive pregenerated voltage values and pregenerated current values, and determine a simulated charge state of the rechargeable power source based on the pregenerated voltage values and the pregenerated current values. The communication interface is further configured to output a computer-readable indication of the simulated charge state.

In some examples, the personal electronic device further comprises a temperature sensor configured to output a digital temperature value representative of a measured temperature associated with the rechargeable power source to the charge state controller, wherein the charge state controller is configured to determine the charge state of the rechargeable power source further based on the digital temperature value, wherein the charge state controller is further configured to: receive pregenerated temperature values, and determine the simulated charge state of the rechargeable power source further based on the pregenerated temperature values.

In some examples, the personal electronic device comprises an integrated circuit comprising the first analog to digital converter, the second analog to digital converter, the temperature sensor, and the charge state controller.

In the same or different examples, the charge state controller is further configured to determine available runtime of the rechargeable power source based on the digital voltage value and the digital current value, wherein the communication interface is further configured to output a computer-readable indication of the available runtime, wherein the charge state controller is further configured to determine simulated available runtime of the rechargeable power source based on the pregenerated voltage values and the pregenerated current values, and wherein the communication interface is further configured to output a computer-readable indication of the simulated available runtime.

In some examples, the charge state controller is configured to determine available runtime of the rechargeable power source further based on indications of usage of an electronic device powered by the rechargeable power source, the indications of usage including at least one of a first group consisting of: power on history, shutdown history, call activity, upstream data transmissions, downstream data transmissions, and charging history. The charge state controller may be configured to determine simulated available runtime of the rechargeable power source further based on pregenerated indications of usage of an electronic device powered by the rechargeable power source, the pregenerated indications of usage including at least one of a second group consisting of: power on history, shutdown history, call activity, upstream data transmissions, downstream data transmissions, and charging history.

In the same or different examples, the charge state controller is configured to determine the charge state of the rechargeable power source based on the digital voltage value and the digital current value over time, wherein the pregenerated voltage values and pregenerated current values represent values over time, wherein the charge state controller is configured to determine the simulated charge state of the rechargeable power source based on the pregenerated voltage values and pregenerated current values over time.

In the same or different examples, the circuit comprises an integrated circuit comprising the first analog to digital converter, the second analog to digital converter, and the charge state controller.

In the same or different examples, the communication interface is selected from a group consisting of: Battery Interface v1.0 Specification, Inter-Integrated Circuit (I²C), Version 5, System Management Bus (SMBus), and Universal Asynchronous Receiver/Transmitter (UART) according to one or more of the following UART models: 16550A, 16C552, 16650, 16750, 16850, 16C850, 16954, 16C954, SCC2691, SCC2692, SCC26C92, SCC2698B, SCC28C94, Z85230, and Hayes ESP.

In the same or different examples, the personal electronic device is a cellular phone.

In a further example, this disclosure is directed to a method comprising receiving, by an integrated circuit, pregenerated voltage values and pregenerated current values. The integrated circuit comprises a first analog to digital converter configured to convert an analog voltage sample of a rechargeable power source into a digital voltage value, a second analog to digital converter configured to convert an analog current sample of the rechargeable power source into a digital current value, a charge state controller configured to determine a charge state of the rechargeable power source based on the digital voltage value and the digital current value, and a communication interface configured to output a computer-readable indication of the charge state. The method further comprises determining, by the charge state controller of the integrated circuit, a simulated charge state of the rechargeable power source based on the pregenerated voltage values and the pregenerated current values, and outputting, by the communication interface of the integrated circuit, a computer-readable indication of the simulated charge state.

In some examples of the method, the integrated circuit further comprises a temperature sensor configured to output a digital temperature value representative of a measured temperature associated with the rechargeable power source to the charge state controller, and the charge state controller is configured to determine the charge state of the rechargeable power source further based on the digital temperature value. The method may further include receiving, by the integrated circuit, pregenerated temperature values, wherein the charge state controller determines the simulated charge state of the rechargeable power source further based on the pregenerated temperature values.

In the same or different examples of the method, the charge state controller is configured to determine the charge state of the rechargeable power source based on the digital voltage value and the digital current value over time, the pregenerated voltage values and pregenerated current values represent values over time, and the charge state controller determines the simulated charge state of the rechargeable power source based on the pregenerated voltage values and pregenerated current values over time.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
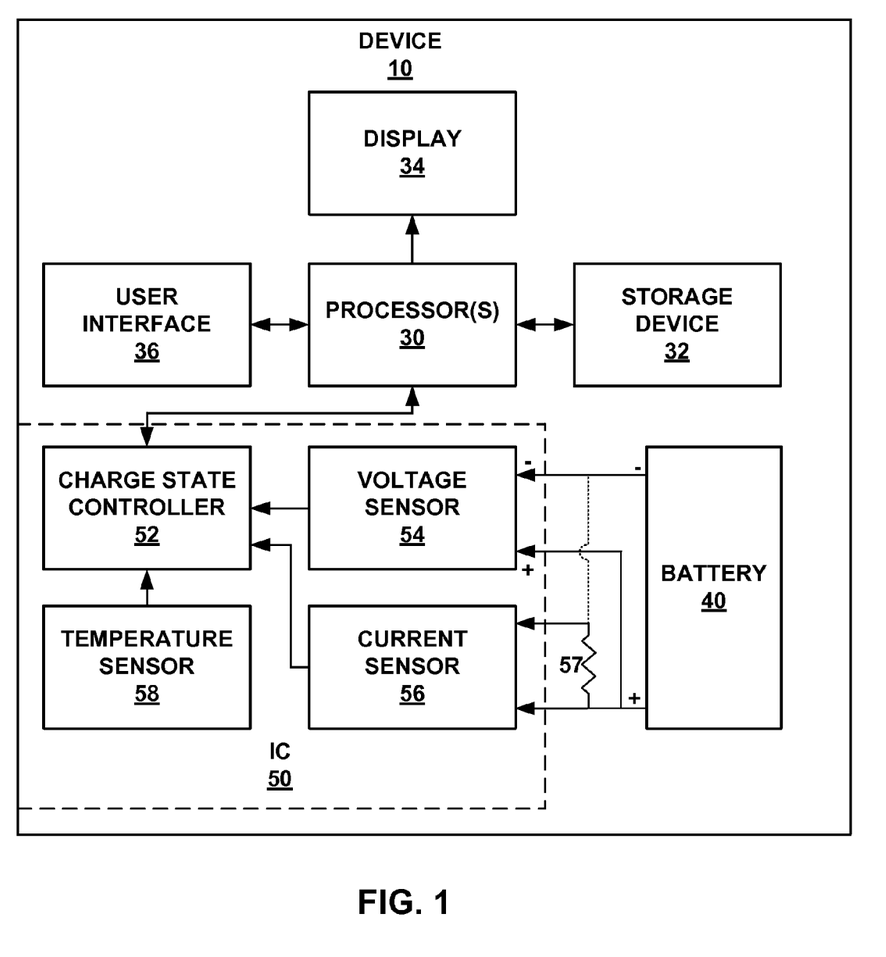
FIG. 1 is a block diagram illustrating an example device with a battery charge meter configured to indicate a charge state of its battery to a user.

FIG. 1 is a block diagram illustrating example device 10 with a battery charge meter embodied within integrated circuit 50 (IC 50). Device 10 is configured to indicate a charge state of its battery to a user. Device 10 further includes processor 30, storage device 32, display 34, user interface 36, and battery 40. In examples where device 10 is a cellular phone, device 10 may also include a telemetry module.

Processor 30, generally speaking, is communicatively connected to and controls operation of storage device 32, display 34, and user interface 36, all of which are powered by rechargeable battery 40. As examples, the different components of FIG. 1 may be communicatively coupled via a data communication bus, one or more direct physical or wireless connections, or via other methods that facilitate communication between the components.

Processor 30 may include any one or more of a microprocessor, a controller, a digital signal processor (DSP), an application specific integrated circuit (ASIC), a field-programmable gate array (FPGA), or equivalent discrete or integrated logic circuitry. The functions attributed to processor 30 in this disclosure may be embodied as software, firmware, hardware and combinations thereof. Although example device 10 of FIG. 1 is illustrated as including one processor 30, other example mobile devices according to this disclosure may include multiple processors that are configured to execute one or more functions attributed to processor 30 of device 10 individually or in different cooperative combinations.

Storage device 32 may comprise a computer-readable storage medium that stores instructions that cause one or more processors, e.g., processor 30, to perform various functions. Storage device 32 may include any volatile, non-volatile, magnetic, optical, or electrical media, such as a random access memory (RAM), read-only memory (ROM), non-volatile RAM (NVRAM), electrically-erasable programmable ROM (EEPROM), flash memory, or any other digital media. Generally, storage device 32 may include instructions that cause processor 30 to perform various functions attributed to the processor 30 in the disclosed examples.

Generally speaking, storage device 32 includes memory that stores software that may be executed by processor 30 to perform various functions for a user of device 10, including, e.g., making and receiving cellular telephone calls or other communications like text or e-mail messages, using various software applications, and browsing the Internet. The software included in device 10 generally includes telemetry and other hardware drivers for the mobile device, operating system software, and applications software.

Device 10 includes display 34, which may be, e.g., a liquid crystal display (LCD), light emitting diode (LED) display, e-ink, or other display. Display 34 presents the content of device 10 to a user. For example, display 34 may present the applications executed on device 10 such as a web browser or a video game, as well as information about device 10, including, e.g., battery life and/or network signal strength. In some examples, display 34 may provide some or all of the functionality of user interface 36. For example, display 34 may be a touch screen that allows the user to interact with device 10. In generally, however, user interface 36 allows a user of device 10 to interact with the device via one or more input mechanisms, including, e.g., an embedded keypad, a keyboard, a mouse, a roller ball, buttons, scroll wheel, touch pad, touch screen, or other devices or mechanisms that allow the user to interact with the device. In addition, user interface 36 may include a microphone and speaker (not shown) for voice communication as well as a touch-sensitive input.

Although device 10 of FIG. 1 is shown as including display 34, aspects of this disclosure should not be considered limited to example devices that include a display. In some examples of device 10, display 34 may be optional. For example, in some examples in which device 10 is a music player or a radio, device 10 may not include a display.

Battery 40 provides power for all of the various components of device 10, and may be rechargeable. Examples of battery 40 include a lithium polymer battery, a lithium ion battery, nickel cadmium battery, and a nickel metal hydride battery. The life of battery 40 of device 10 depends on many factors. Generally, the life of battery 40 is affected by loads on the battery caused by using either software or hardware components of mobile device. As different components of device 10, both different hardware and different software components, draw different amounts of power, the load on battery 40 may vary according to component usage patterns. For example, a backlight for display 34 may draw more power than an accelerometer such that the life of battery 40 of device 10 may decrease significantly with increased backlight usage, while being less impacted by increased usage of the accelerometer. In another example, one system software build for device 10 may generally require more power than another system software build.

IC 50 represents a battery charge meter for device 10. IC 50 includes charge state controller 52, voltage sensor 54, current sensor 56, and temperature sensor 58. Charge state controller 52 is configured to receive a digital voltage value, a digital current value, and a digital temperature value, from voltage sensor 54, current sensor 56, and temperature sensor 58, respectively, and determine a charge state of battery 40 based on the digital voltage value, the digital current value and the digital temperature value. A charge state may indicate a proportion of total battery capacity remaining and/or a predicted runtime of a device powered by the battery. In different examples, charge state controller 52 may be configured to determine a charge state of battery 40 based on the digital voltage value, the digital current value and the digital temperature value instantaneously, or based on digital voltage values, digital current values and digital temperature values sensed over time.

Although IC 50 is illustrated as a separate component, in some examples, IC 50 may be considered to be part of battery 40 (e.g. forming a so-called "smart battery"). In other cases, IC 50 may be a separate component that is located on battery 40 or on a common substrate with battery. In still other cases, IC 50 may be located on a separate substrate relative to battery 40. In some examples, IC 50 and battery 40 may be part of a single integrated assembly. For example, IC 50 and battery 40 may be contained within a common housing separate from other components of device 10. In the same or different examples, IC 50 and battery 40 may be connected to a circuit board substrate separate from a circuit board or substrate to which processor 30 and other components of device 10 are connected.

In some particular examples, voltage sensor 54 includes an analog to digital converter configured to convert an analog voltage sample from the positive and negative terminals of battery 40 into the digital voltage value delivered to charge state controller 52. In some examples, device 10 may include one or more analog components, such as transformers, resisters, capacitors and the like to transform and/or filter analog voltages from battery 40 for sensing by voltage sensor 54.

In these or other examples, current sensor 56 may include an analog to digital converter configured to convert an analog current sample of battery 40 into the digital current value delivered to charge state controller 52. In one design current sensor 56 senses voltages on either side of one or more resistors 57 which is place in series with the components of device 10 powered by battery 40. In some examples, device 10 may include one or more analog components, such as transformers, resisters, capacitors and the like to transform and/or filter analog voltages on either side of the resistor 57 for sensing by voltage sensor 54.

Temperature sensor 58 may include an analog to digital converter configured to convert an analog temperature signal into the digital temperature value delivered to charge state controller 52. In some examples, temperature sensor 58 may include analog components of the temperature sensor that measures an analog temperature. Generally, the measured temperature should correspond to a temperature of battery 40, although it is not necessary for the temperature sensor to be located immediately adjacent to the battery. For example, with personal electronic devices, locating the analog components of the temperature sensor in other places within the device may be sufficient to provide temperature information for determining a charge state of battery 40. In other examples, analog components of the temperature sensor may be located separately from temperature sensor 58 and IC 50. Temperature sensor 58 should be considered optional, as in further examples, charge state controller 52 may be configured to determine a charge state of battery 40 without temperature information.

Charge state controller 52 applies a charge state algorithm to the digital voltage value, the digital current value, and optionally, to the digital temperature value in order to determine a charge state of battery 40. In different examples, charge state controller 52 may be configured to determine a charge state of battery 40 based on the digital voltage value, the digital current value and the digital temperature value instantaneously, or based on digital voltage values, digital current values and digital temperature values sensed over time.

Charge state controller 52 may be configured to output charge state information to processor 30 via a communication interface that operates according to a communication protocol. In some examples, the communication interface may simply be an electrical connection that operates according to a communication protocol. For example, IC 50 and processor 30 may be located on a common circuit board. In the same or different examples, IC 50 and processor 30 may communicate according to a standard or proprietary communication protocol. Examples of suitable communication protocols for communications between IC and processor 30 include, but are not limited to, Battery Interface v1.0 Specification, available from www.mipi.org, Inter-Integrated Circuit ($I^2C$), Version 5, developed in 2012, System Management Bus (SMBus), defined by Intel Corp. in 1995, and/or a Universal Asynchronous Receiver/Transmitter (UART) protocol. Examples of suitable UART models for communications between IC and processor 30 include, but are not limited to: 16550A, 16C552, 16650, 16750, 16850, 16C850, 16954, 16C954, SCC2691, SCC2692, SCC26C92, SCC2698B, SCC28C94, Z85230, and Hayes ESP. Other communication protocols currently available and developed in the future may also be suitable for communications between IC 50 and processor 30.

Processor 30 may then present an indication of the charge state of battery to a user via display 34, and/or user interface 36. For example, processor 30 may present an indication of the charge state of battery 40 to a user according instructions contained in software stored on storage device 32. For example, the indication of the charge state of battery 40 may include an indication of the proportion of total charge remaining and/or an indication of available runtime for device 10.

In the same or different examples, charge state controller 52 and/or processor 30 may be configured to determine available runtime of battery 40 further based on indications of usage of device 10. Potential indications of usage that may be used to determine available runtime of battery 40 include, but are not limited to, power on history of device 10, shutdown history of device 10, call activity of device 10, upstream data transmissions of device 10, downstream data transmissions of device 10, and/or a record of charging history of device 10. In some examples, one or more of these factors may be applied by charge state controller 52 to provide an indication of available runtime to processor 30. In the same or different examples, processor 30 may apply one or more of these factors to charge state information from charge state controller 52 in order to provide an indication of available runtime to the user.

Testing and development of the charge state algorithms utilized by charge state controller 52 may take significant time, effort and cost. For example, verifying suitable performance of charge state controller 52 may require running many battery usage scenarios using actual load currents, voltages, and batteries under different temperature conditions. Such testing generally requires the use of accurate measurement instruments (source meters, battery testers, temperature-controlled chambers etc.), as well as trained personnel to run the experiments.

In order to accelerate the process of evaluation of a charge state algorithm, a manufacturer of a charge state controller may provide standalone simulation software including the charge state algorithm that may be run on general purpose computers to third-party device manufacturers, such as a manufacturer of device 10. This may allow testing of the charge state algorithm using pregenerated sensor data, including voltage, current, and/or temperature data rather than actively sensing voltages, currents and temperatures during testing. However, such a solution may provide disadvantages, such as disadvantages in testing accuracy as well increasing the risk that a proprietary charge state algorithm is exposed to a competitor. As one example, the standalone simulation software is a separate product that the manufacturer has to maintain in sync with the IC firmware. In addition, providing standalone simulation software including the charge state algorithm results in risks that competitors may be able to reverse engineer a proprietary charge state algorithm. In addition, because, with standalone simulation software, a charge state algorithm does not run on the actual IC hardware, such as IC 50, the standalone simulation software may not provide the same results as IC 50.

As another example, in order to accelerate the process of evaluation of a charge state algorithm, a manufacturer of a charge state controller, may provide software model including the charge state algorithm that can be executed within a commercial tool (e.g. Matlab) on general purpose computers to third-party device manufacturers, such as a manufacturer of device 10. This may allow testing of the charge state algorithm using pregenerated sensor data, including voltage, current, and/or temperature data rather than actively sensing voltages, currents and temperatures during testing. However, such a solution may provide disadvantages, such as disadvantages in testing accuracy as well increasing the risk that a proprietary charge state algorithm is exposed to a competitor. As one example, third-party device manufacturers may not have access to the commercial tool, as it may require an expensive software license. As another example, the software model is a separate product that the manufacturer has to maintain in sync with the IC firmware. In addition, providing software model including the charge state algorithm results in risks that competitors may be able to reverse engineer a proprietary charge state algorithm. In addition, because, a with software model, a charge state algorithm does not run on the actual IC hardware, such as IC 50, the software model may not provide the same results as IC 50.

In another example, in order to accelerate the process of evaluation of a charge state algorithm, a manufacturer of a charge state controller, may provide a hardware simulator, such as a field-programmable gate array (FPGA) board, including the charge state algorithm to third-party device manufacturers, such as a manufacturer of device 10. This may allow testing of the charge state algorithm using pregenerated sensor data, including voltage, current, and/or temperature data rather than actively sensing voltages, currents and temperatures during testing. However, such a solution may provide disadvantages, such as disadvantages in testing accuracy as well increasing the risk that a proprietary charge state algorithm is exposed to a competitor. As one example, the hardware simulator is a separate article that the manufacturer has to maintain in sync with the IC firmware. In addition, providing a hardware simulator including the charge state algorithm creates added risk that competitors may be able to reverse engineer a proprietary charge state algorithm. In addition, because, with a hardware simulator, a charge state algorithm does not run on the actual IC hardware, such as IC 50, the hardware simulator may not provide the same results as IC 50.

Figure 2:
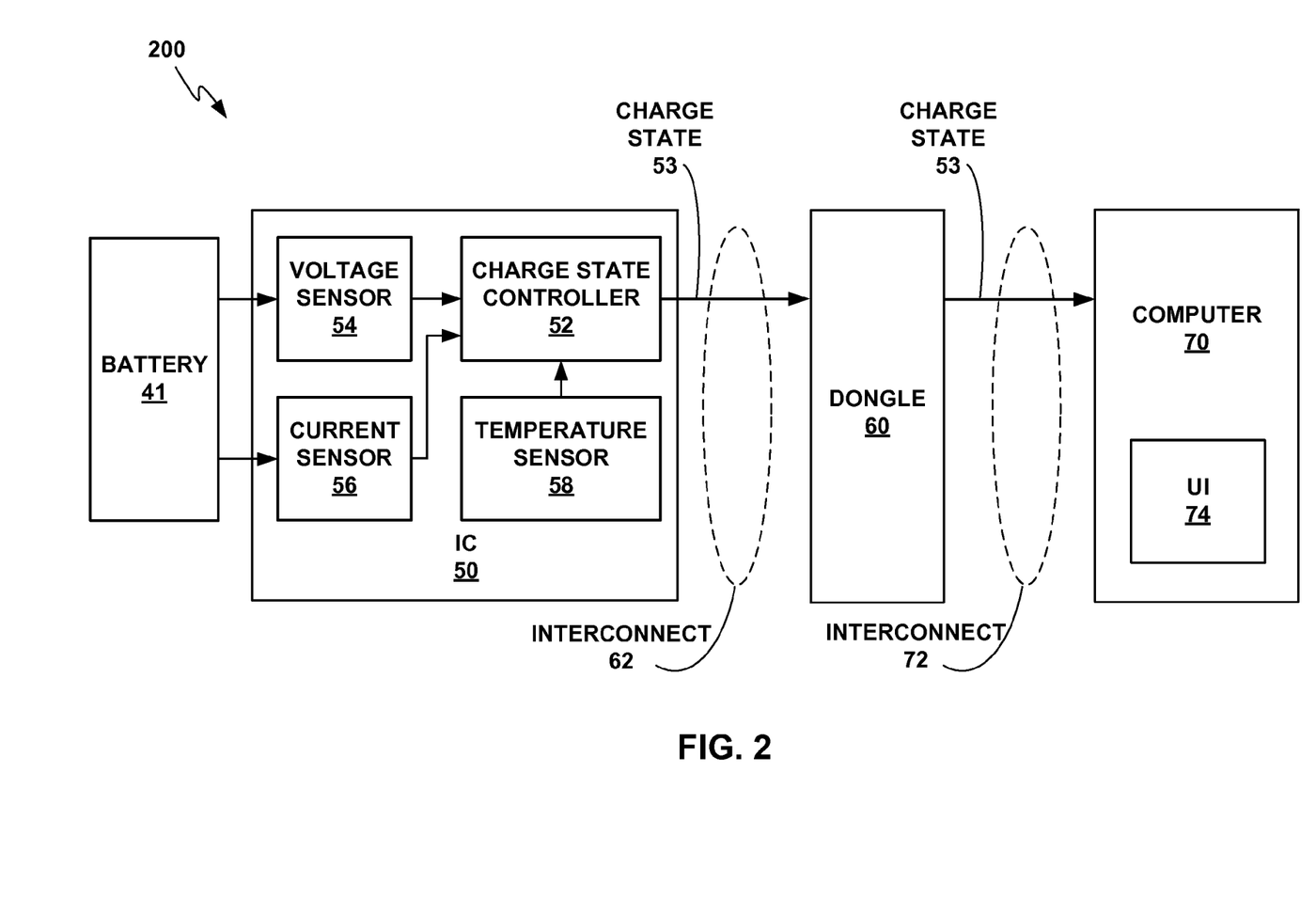
FIG. 2 is block diagram including, a battery, the battery charge meter of FIG. 1 operationally connected to the battery, a computer, and a dongle that operationally connects the battery charge meter to the computer.
Figure 3:
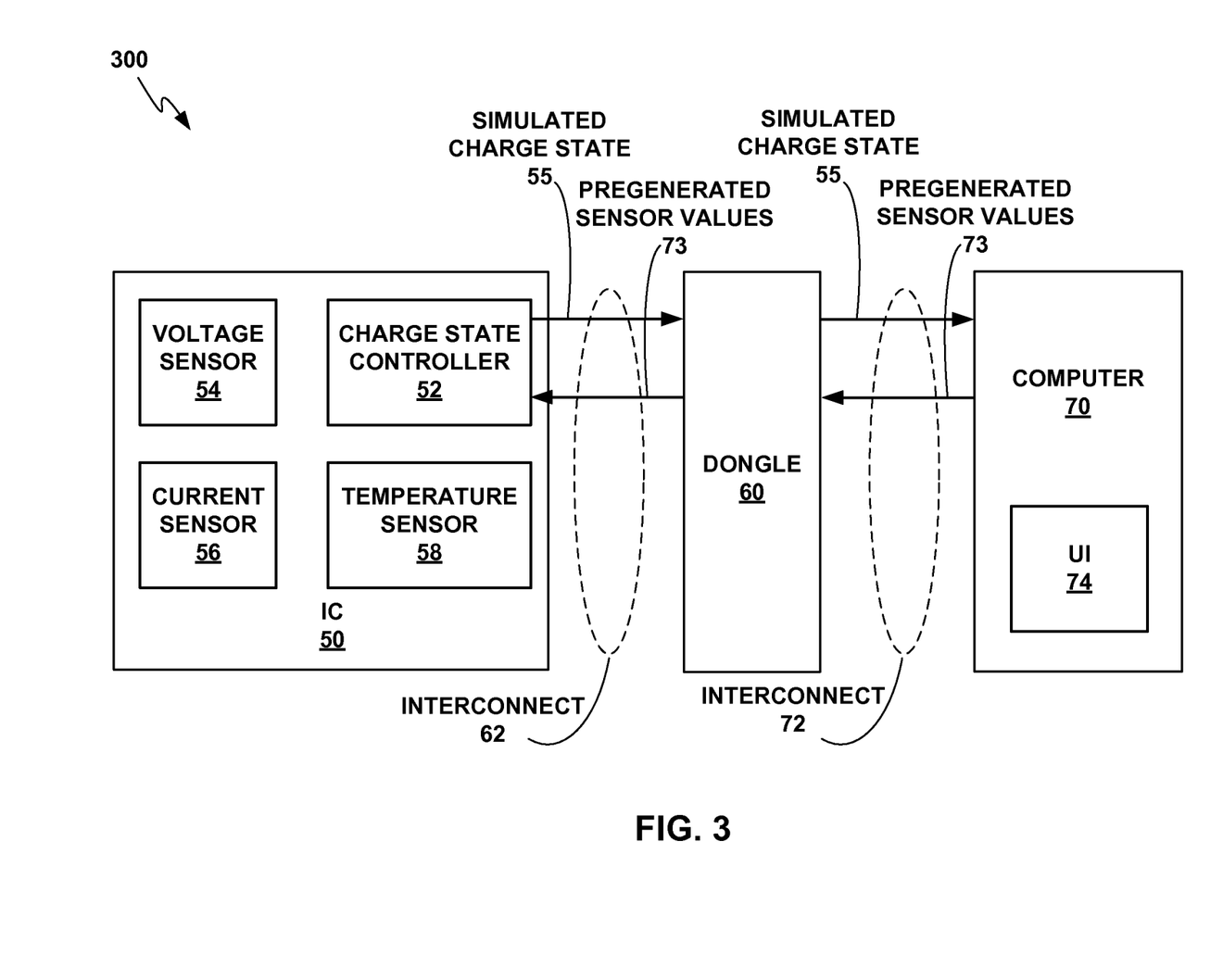
FIG. 3 is block diagram including the battery charge meter of FIG. 1, a computer, and a dongle that operationally connects the battery charge meter to the computer, with the computer being configured to deliver pregenerated sensor data to the battery charge meter for testing of the battery charge meter.

As illustrated in FIG. 2 and FIG. 3, IC 50 may be connected to a general purpose computer via an application board or dongle to facilitate testing of the charge state algorithm implemented by IC 50. As shown in FIG. 2, such testing may utilize real-time sensing of a battery. Alternately, as shown in FIG. 3, IC 50 may receive pregenerated sensor information from the general purpose computer and apply the charge state algorithm to the pregenerated sensor information.

FIG. 2 is block diagram of an assembly 200 that includes battery 40, IC 50 operationally connected to battery 41, computer 70, and dongle 60. Dongle 60 operationally connects IC 50, which incorporates a battery charge meter, to computer 70.

Specifically, as shown in FIG. 2, IC 50 includes charge state controller 52, voltage sensor 54, current sensor 56, and temperature sensor 58. Charge state controller 52 is configured to receive a digital voltage value, a digital current value, and a digital temperature value, from voltage sensor 54, current sensor 56, and temperature sensor 58, respectively, and determine a charge state of battery 41 based on the digital voltage value, the digital current value and the digital temperature value. In different examples, charge state controller 52 may be configured to determine a charge state of battery 41 based on the digital voltage value, the digital current value and the digital temperature value instantaneously, or based on digital voltage values, digital current values and digital temperature values sensed over time.

IC 50 is operationally coupled to computer 70 via dongle 60. More specifically, IC 50 is operationally coupled to dongle 60 via communication interconnect 62, and dongle 60 is operationally coupled to computer 70 via communication interconnect 72. IC 50 and dongle 60 may communicate according to a standard communication protocol. Examples of suitable communication protocols for communications between IC 50 and dongle 60 include, but are not limited to, Battery Interface v1.0 and/or v.1.1 Specification, available from www.mipi.org, Inter-Integrated Circuit ($I^2C$), Version 5, developed in 2012, System Management Bus (SMBus), defined by Intel Corp. in 1995, and/or a Universal Asynchronous Receiver/Transmitter (UART) protocol. Examples of suitable UART models for communications between IC and processor 30 include, but are not limited to: 16550A, 16C552, 16650, 16750, 16850, 16C850, 16954, 16C954, SCC2691, SCC2692, SCC26C92, SCC2698B, SCC28C94, Z85230, and Hayes ESP. Other communication protocols currently available and developed in the future may also be suitable for communications between IC 50 and dongle 60. Likewise, dongle 60 and computer 70 may communicate according to a standard communication protocol, such as a Universal Serial Bus (USB) protocol. Examples of suitable USB protocols include USB 1.1, USB 2.0, USB 3.0 and USB 3.1. Dongle 60 and/or IC 50 may also be electrically powered via interconnects 62, 72. In some examples, dongle 60 may be replaced with any other intermediate device to connect IC 50 to computer 70, such as printed circuit board, which may conform to a standard, such as a Peripheral Component Interconnect (PCI) or PCI Express standard. In further examples, IC 50 may be configured to communicate directly with the computer 70, via one of the aforementioned or other communication standards or a proprietary standard. In this manner, dongle 60 merely represents an optional intermediary between IC 50 and computer 70.

In addition, while the aforementioned examples generally relate to wired connections, in the same or different examples, one or both of interconnects 62, 72 may include wireless connections, including, but not limited to, wi-fi, Bluetooth or other near-field or far-field wireless connections.

Assembly 200 facilitates testing of IC 50 separate from device 10. Specifically, assembly 200 allows an operator to communicate with IC 50 via computer 70 in order to evaluate the performance of hardware of IC 50 as well as the charge state algorithms implemented by charge state controller 52 during testing of battery 41. In some examples, battery 41 may be substantially similar to a battery in a device including IC 50, such as battery 40 (FIG. 1). Specifically, charge state controller 52 is configured to output a computer-readable indication of the charge state 53 to computer 70 via interconnect 62, dongle 60 and interconnect 72. In turn, computer 70 may output indications of charge state 53 to the user via user interface 74.

In order to facilitate testing of the charge state algorithms implemented by IC 50, charge state controller 52 is further configured to receive pregenerated voltage values, pregenerated current values and, optionally, pregenerated temperature values, and determine a simulated charge state of the rechargeable power source based on the pregenerated voltage values, the pregenerated current values, and, optionally, the pregenerated temperature values. Such an example is illustrated in FIG. 3. The simulated charge state may indicate a proportion of total battery capacity remaining and/or a predicted runtime of a device powered by the battery.

FIG. 3 is block diagram of an assembly 300 that includes IC 50, computer 70, and dongle 60. Dongle 60 operationally connects IC 50, which incorporates a battery charge meter, to computer 70. Computer 70 is configured to deliver pregenerated sensor data to IC 50 for testing of the battery charge meter.

IC 50 is operationally coupled to computer 70 via dongle 60. More specifically, IC 50 is operationally coupled to dongle 60 via communication interconnect 62, and dongle 60 is operationally coupled to computer 70 via communication interconnect 72. IC 50 and dongle 60 may communicate according to a standard communication protocol. Examples of suitable communication protocols for communications between IC 50 and dongle 60 include, but are not limited to, Battery Interface v1.0 Specification, available from www.mipi.org, Inter-Integrated Circuit (I²C), Version 5, developed in 2012, System Management Bus (SMBus), defined by Intel Corp. in 1995, and/or a Universal Asynchronous Receiver/Transmitter (UART) protocol. Examples of suitable UART models for communications between IC and processor 30 include, but are not limited to: 16550A, 16C552, 16650, 16750, 16850, 16C850, 16954, 16C954, SCC2691, SCC2692, SCC26C92, SCC2698B, SCC28C94, Z85230, and Hayes ESP. Other communication protocols currently available and developed in the future may also be suitable for communications between IC 50 and dongle 60. Likewise, dongle 60 and computer 70 may communicate according to a standard communication protocol, such as a Universal Serial Bus (USB) protocol. Examples of suitable USB protocols include USB 1.1, USB 2.0, USB 3.0 and USB 3.1. Dongle 60 and/or IC 50 may also be electrically powered via interconnects 62, 72.

As discussed with respect to FIG. 1 and FIG. 2, IC 50 includes charge state controller 52, voltage sensor 54, current sensor 56, and temperature sensor 58. However, within assembly 300, voltage sensor 54, current sensor 56, and temperature sensor 58 are disabled or unused. Charge state controller 52 is configured to receive a digital voltage value, a digital current value, and a digital temperature value, from voltage sensor 54, current sensor 56, and temperature sensor 58, respectively, and determine a charge state of a battery, such as battery 40 or battery 41, based on the digital voltage value, the digital current value and the digital temperature value. As discussed with respect to assembly 200 (FIG. 2), charge state controller is configured to output a computer-readable indication of the charge state of battery 41 to computer 70 via interconnect 62, dongle 60 and interconnect 72.

In addition, as illustrated with respect to assembly 300, charge state controller 52 is further configured to receive pregenerated voltage values and pregenerated current values, and optionally, pregenerated temperature values from computer 70, and determine a simulated charge state of a battery based on the pregenerated voltage values, the pregenerated current values, and, optionally, pregenerated temperature values. The simulated charge state may indicate a proportion of total battery capacity remaining and/or a predicted runtime of a device powered by the battery. Charge state controller 52 is configured to output a computer-readable indication of the simulated charge state to computer 70 via interconnect 62, dongle 60 and interconnect 72.

In this manner, IC 50 facilitates testing of IC 50 separate from device 10 and even separate from a battery within assembly 300. Specifically, assembly 300 allows an operator to communicate with IC 50 via computer 70 in order to evaluate the performance of hardware of IC 50 as well as the charge state algorithms implemented by charge state controller 52 during testing.

More specifically, assembly 300 provides a simulation environment whereby a device manufacturer or other user may evaluate IC 50, including charge state controller 52 and associated charge state algorithms. Specifically, a user may issue instructions to charge state controller 52 via computer interconnect 72, dongle 60 and interconnect 62 to determine a simulated charge state of the rechargeable power source based on pregenerated voltage values, pregenerated current values, and, optionally, pregenerated temperature values. Specifically, charge state controller 52 is configured to output a computer-readable indication of the stimulated charge state 55 to computer 70 via interconnect 62, dongle 60 and interconnect 72.

While a battery is not shown in FIG. 3, the techniques of FIG. 3 are also applicable to testing of examples in which IC 50 and battery 40 may be part of a single integrated assembly, as discussed with respect to FIG. 1. In such examples, even though battery 40 would be part of assembly 300, voltage sensor 54, current sensor 56, and temperature sensor 58 would still be disabled or unused for purposes of testing of charge state controller 52 using simulated data.

Charge state controller 52 may be configured to determine a simulated charge state including a simulated available runtime of a power source further based on pregenerated indications of usage of a device associated with charge state controller 52. Potential pregenerated indications of usage that may be used to determine available runtime of the power source include, but are not limited to, power on history of the device, shutdown history of the device, call activity of the device, upstream data transmissions of the device, downstream data transmissions of the device, and/or a record of charging history of the device. In some examples, one or more of these factors may be applied by charge state controller 52 to provide an indication of available runtime to computer 70.

Computer 70 may output indications of stimulated charge state 55 to the user via user interface 74. For example, computer 70 may run an executable software program that facilitates testing IC 50 via dongle 60. Stimulated charge state 55 is based on pregenerated voltage values, pregenerated current values, and, optionally, pregenerated temperature values, and not on measurements from voltage sensor 54, current sensor 56, and temperature sensor 58.

The techniques of FIG. 3 may provide one or more advantages. For example, by operating IC 50 and charge state controller 52 without doing physical measurements on a battery, testing can be performed much faster than testing using physical measurements of a battery, e.g., as shown with assembly 200 in FIG. 2. In addition, as compared to using a separate hardware or software to test charge state algorithms, because the actual hardware of IC 50 is tested, testing may be expected to provide accurate results, and further, a specialized testing product or software does not need to be produced or maintained by the manufacturer of IC 50. In addition, because there is no separate standalone software or software model including a charge state algorithm, the risk that a third party may reverse engineer the charge state algorithm is relatively lower. As another example, development of IC 50, charge state controller 52 and associated charge state algorithms may also utilize the functionality provided by assembly 300. For example, assembly 300 may be used to execute regression tests following modification of hardware or firmware on IC 50. Thus, the techniques of FIG. 3 may provide an efficient and effective method to catch bugs resulting from changes to hardware or firmware of IC 50.

Figure 4:
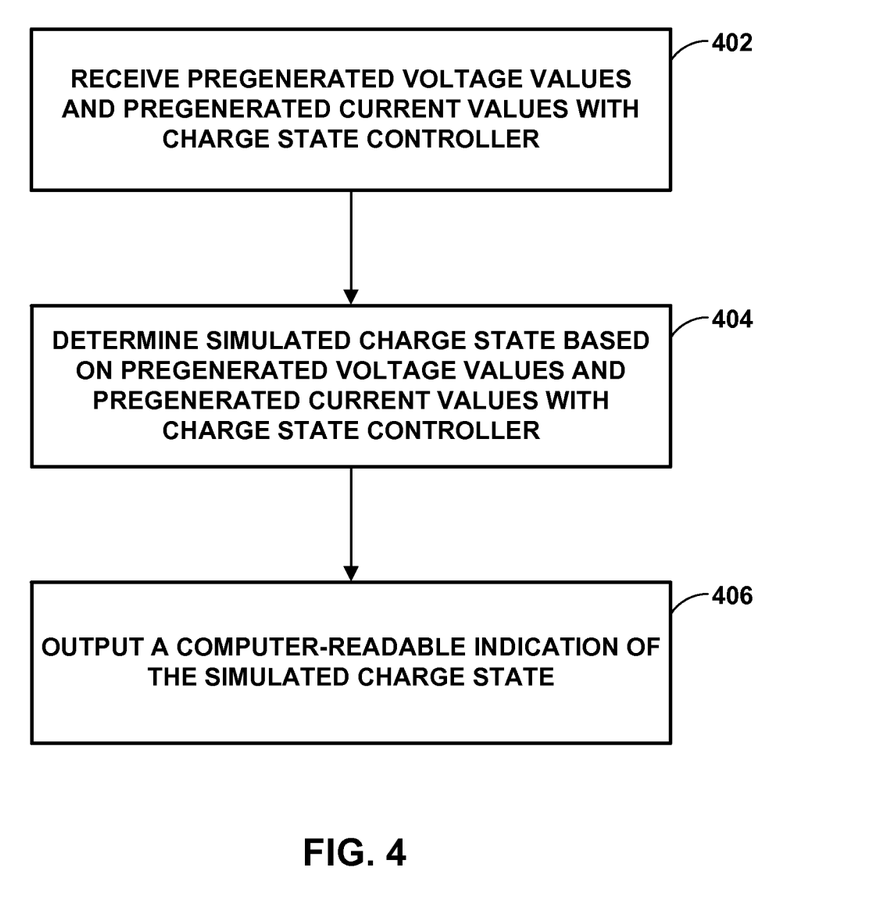
FIG. 4 is a flowchart illustrating techniques for determining a simulated charge state of the rechargeable power source, based on pregenerated voltage values, pregenerated current values and, optionally, pregenerated temperature values, with a charge state controller of an integrated circuit.

FIG. 4 is a flowchart illustrating techniques for determining a simulated charge state of the rechargeable power source based on pregenerated voltage values, pregenerated current values and, optionally, pregenerated temperature values with a charge state controller of an integrated circuit.

For clarity, the techniques of FIG. 4 are described with respect to assembly 300, including IC 50, as illustrated in FIG. 3.

IC 50 receives pregenerated voltage values and pregenerated current values from computer 70 (402). In some examples, IC 50 may further receive pregenerated temperature values from computer 70. Based on the pregenerated voltage values and the pregenerated current values, and, optionally, pregenerated temperature values, charge state controller 52 determines a simulated charge state of a rechargeable power source (404). In some examples, charge state controller 53, may determine the simulated charge state of the rechargeable power source based on the pregenerated voltage values and pregenerated current values, and, optionally, pregenerated temperature values, indicated by computer 70 over time. IC 50 outputs, by communication interconnect 62, a computer-readable indication of the simulated charge state (406).

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various aspects have been described in this disclosure. These and other aspects are within the scope of the following claims.

What is claimed is:

1. A circuit comprising:
   a first analog to digital converter configured to convert an analog voltage sample of a rechargeable power source into a digital voltage value;
   a second analog to digital converter configured to convert an analog current sample of the rechargeable power source into a digital current value;
   a charge state controller configured to determine a charge state of the rechargeable power source based on the digital voltage value and the digital current value; and
   a communication interface configured to output a computer-readable indication of the charge state,
   wherein the charge state controller is further configured to: receive pregenerated voltage values and pregenerated current values, and determine a simulated charge state of the rechargeable power source based on the pregenerated voltage values and the pregenerated current values, and
   wherein the communication interface is further configured to output a computer-readable indication of the simulated charge state.

2. The circuit of claim 1, further comprising a temperature sensor configured to output a digital temperature value representative of a measured temperature associated with the rechargeable power source to the charge state controller,
   wherein the charge state controller is configured to determine the charge state of the rechargeable power source further based on the digital temperature value,
   wherein the charge state controller is further configured to: receive pregenerated temperature values, and determine the simulated charge state of the rechargeable power source further based on the pregenerated temperature values.

3. The circuit of claim 2, wherein the circuit comprises an integrated circuit comprising the first analog to digital converter, the second analog to digital converter, the temperature sensor, and the charge state controller.

4. The circuit of claim 1,
   wherein the charge state controller is further configured to determine available runtime of the rechargeable power source based on the digital voltage value and the digital current value,
   wherein the communication interface is further configured to output a computer-readable indication of the available runtime,
   wherein the charge state controller is further configured to determine simulated available runtime of the rechargeable power source based on the pregenerated voltage values and the pregenerated current values, and
   wherein the communication interface is further configured to output a computer-readable indication of the simulated available runtime.

5. The circuit of claim 4,
   wherein the charge state controller is configured to determine available runtime of the rechargeable power source further based on indications of usage of an electronic device powered by the rechargeable power source, the indications of usage including at least one of a first group consisting of:

power on history;
shutdown history;
call activity;
upstream data transmissions;
downstream data transmissions; and
charging history, and
wherein the charge state controller is configured to determine simulated available runtime of the rechargeable power source further based on pregenerated indications of usage of an electronic device powered by the rechargeable power source, the pregenerated indications of usage including at least one of a second group consisting of:
power on history;
shutdown history;
call activity;
upstream data transmissions;
downstream data transmissions; and
charging history.

6. The circuit of claim 1,
wherein the charge state controller is configured to determine the charge state of the rechargeable power source based on the digital voltage value and the digital current value over time,
wherein the pregenerated voltage values and pregenerated current values represent values over time, and
wherein the charge state controller is configured to determine the simulated charge state of the rechargeable power source based on the pregenerated voltage values and pregenerated current values over time.

7. The circuit of claim 1, wherein the circuit comprises an integrated circuit comprising the first analog to digital converter, the second analog to digital converter, and the charge state controller.

8. The circuit of claim 1, wherein the communication interface is selected from a group consisting of:
Battery Interface v1.0 Specification;
Inter-Integrated Circuit (I²C), Version 5;
System Management Bus (SMBus); and
Universal Asynchronous Receiver/Transmitter (UART) according to one or more of the following UART models: 16550A, 16C552, 16650, 16750, 16850, 16C850, 16954, 16C954, SCC2691, SCC2692, SCC26C92, SCC2698B, SCC28C94, Z85230, and Hayes ESP.

9. A personal electronic device comprising:
a rechargeable power source;
a voltage sensor;
a current sensor;
a first analog to digital converter configured to convert an analog voltage sample of the rechargeable power source from the voltage sensor into a digital voltage value;
a second analog to digital converter configured to convert an analog current sample of the rechargeable power source the current sensor into a digital current value;
a charge state controller configured to determine a charge state of the rechargeable power source based on the digital voltage value and the digital current value; and
a communication interface configured to output a computer-readable indication of the charge state,
wherein the charge state controller is further configured to: receive pregenerated voltage values and pregenerated current values, and determine a simulated charge state of the rechargeable power source based on the pregenerated voltage values and the pregenerated current values, and
wherein the communication interface is further configured to output a computer-readable indication of the simulated charge state.

10. The personal electronic device of claim 9, further comprising a temperature sensor configured to output a digital temperature value representative of a measured temperature associated with the rechargeable power source to the charge state controller,
wherein the charge state controller is configured to determine the charge state of the rechargeable power source further based on the digital temperature value,
wherein the charge state controller is further configured to: receive pregenerated temperature values, and determine the simulated charge state of the rechargeable power source further based on the pregenerated temperature values.

11. The personal electronic device of claim 10, wherein the personal electronic device comprises an integrated circuit comprising the first analog to digital converter, the second analog to digital converter, the temperature sensor, and the charge state controller.

12. The personal electronic device of claim 9,
wherein the charge state controller is further configured to determine available runtime of the rechargeable power source based on the digital voltage value and the digital current value,
wherein the communication interface is further configured to output a computer-readable indication of the available runtime,
wherein the charge state controller is further configured to determine simulated available runtime of the rechargeable power source based on the pregenerated voltage values and the pregenerated current values, and
wherein the communication interface is further configured to output a computer-readable indication of the simulated available runtime.

13. The personal electronic device of claim 12,
wherein the charge state controller is configured to determine available runtime of the rechargeable power source further based on indications of usage of an electronic device powered by the rechargeable power source, the indications of usage including at least one of a first group consisting of:
power on history;
shutdown history;
call activity;
upstream data transmissions;
downstream data transmissions; and
charging history, and
wherein the charge state controller is configured to determine simulated available runtime of the rechargeable power source further based on pregenerated indications of usage of an electronic device powered by the rechargeable power source, the pregenerated indications of usage including at least one of a second group consisting of:
power on history;
shutdown history;
call activity;
upstream data transmissions;
downstream data transmissions; and
charging history.

14. The personal electronic device of claim 9,
wherein the charge state controller is configured to determine the charge state of the rechargeable power source based on the digital voltage value and the digital current value over time, wherein the pregenerated voltage values and pregenerated current values represent values over time, wherein the charge state controller is configured to determine the simulated charge state of the rechargeable power source based on the pregenerated voltage values and pregenerated current values over time.

15. The personal electronic device of claim 9, wherein the circuit comprises an integrated circuit comprising the first analog to digital converter, the second analog to digital converter, and the charge state controller.

16. The personal electronic device of claim 9, wherein the communication interface is selected from a group consisting of:
Battery Interface v1.0 Specification;
Inter-Integrated Circuit ($I^2C$), Version 5;
System Management Bus (SMBus); and
Universal Asynchronous Receiver/Transmitter (UART) according to one or more of the following UART models: 16550A, 16C552, 16650, 16750, 16850, 16C850, 16954, 16C954, SCC2691, SCC2692, SCC26C92, SCC2698B, SCC28C94, Z85230, and Hayes ESP.

17. The personal electronic device of claim 9, wherein the personal electronic device is a cellular phone.

18. A method comprising:
receiving, by an integrated circuit, pregenerated voltage values and pregenerated current values,
wherein the integrated circuit comprises:
a first analog to digital converter configured to convert an analog voltage sample of a rechargeable power source into a digital voltage value;
a second analog to digital converter configured to convert an analog current sample of the rechargeable power source into a digital current value;
a charge state controller configured to determine a charge state of the rechargeable power source based on the digital voltage value and the digital current value; and
a communication interface configured to output a computer-readable indication of the charge state;

determining, by the charge state controller of the integrated circuit, a simulated charge state of the rechargeable power source based on the pregenerated voltage values and the pregenerated current values, and outputting, by the communication interface of the integrated circuit, a computer-readable indication of the simulated charge state.

19. The method of claim 18,
wherein the integrated circuit further comprises a temperature sensor configured to output a digital temperature value representative of a measured temperature associated with the rechargeable power source to the charge state controller, wherein the charge state controller is configured to determine the charge state of the rechargeable power source further based on the digital temperature value, the method further comprising receiving, by the integrated circuit, pregenerated temperature values, wherein the charge state controller determines the simulated charge state of the rechargeable power source further based on the pregenerated temperature values.

20. The method of claim 18,
wherein the charge state controller is configured to determine the charge state of the rechargeable power source based on the digital voltage value and the digital current value over time, wherein the pregenerated voltage values and pregenerated current values represent values over time, wherein the charge state controller determines the simulated charge state of the rechargeable power source based on the pregenerated voltage values and pregenerated current values over time.

* * * * *